United States Patent [19]

Crumly et al.

[11] Patent Number: 5,009,605
[45] Date of Patent: Apr. 23, 1991

[54] FLAT ELECTRICAL CONNECTOR ASSEMBLY WITH PRECISELY ALIGNED SOLDERING TRACES

[75] Inventors: William R. Crumly, Anaheim; Blake F. Woith, La Verne; James R. Walen, Mission Viejo, all of Calif.

[73] Assignee: Hughes Aircraft Company, Los Angeles, Calif.

[21] Appl. No.: 493,050

[22] Filed: Mar. 13, 1990

[51] Int. Cl.$^5$ .............................................. H01R 9/09
[52] U.S. Cl. ..................................... 439/67; 439/493
[58] Field of Search ................ 439/67, 77, 492, 493, 439/329, 632; 29/872, 873

[56] References Cited

U.S. PATENT DOCUMENTS

| | | | |
|---|---|---|---|
| 3,038,140 | 6/1962 | Haberland | 439/67 X |
| 4,018,496 | 4/1977 | Bilsback | 439/67 |
| 4,125,310 | 11/1978 | Reardon et al. | 439/329 |
| 4,453,795 | 6/1984 | Moulin . | |
| 4,731,503 | 3/1988 | Kitanishi | 439/492 X |
| 4,923,406 | 5/1990 | Bucknam | 439/77 |

FOREIGN PATENT DOCUMENTS 2203905 10/1988 United Kingdom ................ 439/492

Primary Examiner—Neil Abrams
Assistant Examiner—Khiem Nguyen
Attorney, Agent, or Firm—Terje Gudmestad; Wanda K. Denson-Low

[57] ABSTRACT

A hardboard (12) and a flat flexible cable (14) each carry a number of electrically conductive leads or traces (16, 18) having main portions which extend parallel to the longitudinal axes (12a, 14a) thereof. Conjugate connector portions (16a, 18a) of the traces (16, 18) extend from the ends of the main portions thereof at an acute angle ($\theta$), such that the connector portions (18a) of the cable (14) are aligned over the connector portions (16a) of the hardboard (12) for soldering when the cable (14) is mated to the hardboard (12). The cable (14) is stiff and difficult to move laterally, but may be shifted longitudinally with small effort. Longitudinal relative movement of the cable (14) and hardboard (12) causes parallel shifting of the angled connector portions (18a) of the cable (14) relative to the connector portions (16a) of the hardboard (12), thereby enabling precise lateral adjustment of the connector portions (16a, 18a) without lateral relative movement between the cable (14) and the hardboard (12).

10 Claims, 3 Drawing Sheets

FLAT ELECTRICAL CONNECTOR ASSEMBLY WITH PRECISELY ALIGNED SOLDERING TRACES

BACKGROUND OF THE INVENTION

1. Field of the Invention

The present invention generally relates to the field of electrical connectors, and more specifically to an arrangement which mates a flat, flexible cable to a hardboard such that conjugate soldering traces on the cable and hardboard may be precisely aligned in the lateral direction by moving the cable relative to the hardboard in the longitudinal direction.

2. Description of the Related Art

Rigid and flexible members in the form of sheets or panels have been fabricated in a number of configurations which include conjugate electrically conductive leads or traces for connection of the members to each other at their edges. The members are mated such that the edge or connector portions of the traces are aligned, and pressed together to complete the interconnection. U.S. Pat. No. 4,453,795, entitled "CABLE-TO-CABLE/COMPONENT ELECTRICAL PRESSURE WAFER CONNECTOR ASSEMBLY", issued June 12, 1984, to Norbert L. Moulin, teaches how metallic buttons or dots may be formed on one or both of the conjugate surfaces of the traces to facilitate ohmic connection therebetween in response to applied pressure. Alternatively, the mating connector portions of the traces may be aligned, and interconnected by soldering.

The present invention particularly relates to a connector assembly including a hardboard having traces which terminate in soldering pads formed on a surface thereof, and a flat, flexible cable formed with traces which terminate in soldering fingers for alignment with the respective soldering pads when the cable is mated to the hardboard. Soldering of the fingers to the pads is performed after the alignment has been performed and confirmed. In a typical application including such a connector assembly, a daughterboard includes two hardboards fixed to each other back-to-back, with the soldering pads formed on the lower edges of the hardboards. A flat, flexible cable extends around the lower edge of the daughterboard, and is formed with parallel traces which terminate at their ends in soldering fingers which mate with the soldering pads on the two hardboards. Metallic dots such as disclosed in the above referenced patent extend downwardly from the traces away from the lower edge of the daughterboard, and mate with conjugate traces on a motherboard or pin type connector which plugs into a conjugate pin type connector mounted on a motherboard.

The flexible cable is easy to bend, twist, or shift parallel to its longitudinal axis enabling it to conform to a labyrinthine path interconnecting remotely mounted hardboards. However, it is hard to shift the cable laterally when it is pressed against the surface of a hardboard, especially when the cable has relatively sharp bends resulting, for example, from extending it around the edge of a daughterboard. This makes lateral alignment of the conjugate soldering portions of the traces on the cable and hardboard, which extend parallel to the longitudinal axes thereof, difficult to perform. Although a certain amount of lateral misalignment is permissible where there are a small number of relatively large traces, current technology enables the fabrication of a very large number of small, closely spaced traces, requiring a correspondingly high degree of precision in lateral alignment accuracy.

SUMMARY OF THE INVENTION

The present invention enables two generally flat members, each having electrically conductive traces formed with connector portions thereon, to be mated together with the conjugate connector portions precisely aligned with each other. The connector portions are oriented at an acute angle to the longitudinal axes of the members, such that longitudinal relative movement between the members enables the connector portions to be laterally aligned. The invention is particular suited to an assembly of a flat, flexible cable to a hardboard. However, the invention is not so limited, and is further applicable to an assembly of two hardboards, or two flexible cables.

In a preferred embodiment of the invention, a hardboard and a flat flexible cable each carry a number of electrically conductive leads or traces having main portions which extend parallel to the longitudinal axes thereof. Conjugate connector portions of the traces extend from the ends of the main portions thereof at an acute angle such that the connector portions of the cable are aligned over the connector portions of the hardboard for soldering when the cable is mated to the hardboard. The cable is stiff and difficult to move laterally, but may be shifted longitudinally with small effort. Longitudinal relative movement of the cable and hardboard causes parallel shifting of the angled connector portions of the cable relative to the connector portions of the hardboard, thereby enabling precise lateral adjustment of the connector portions without lateral relative movement between the cable and the hardboard.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
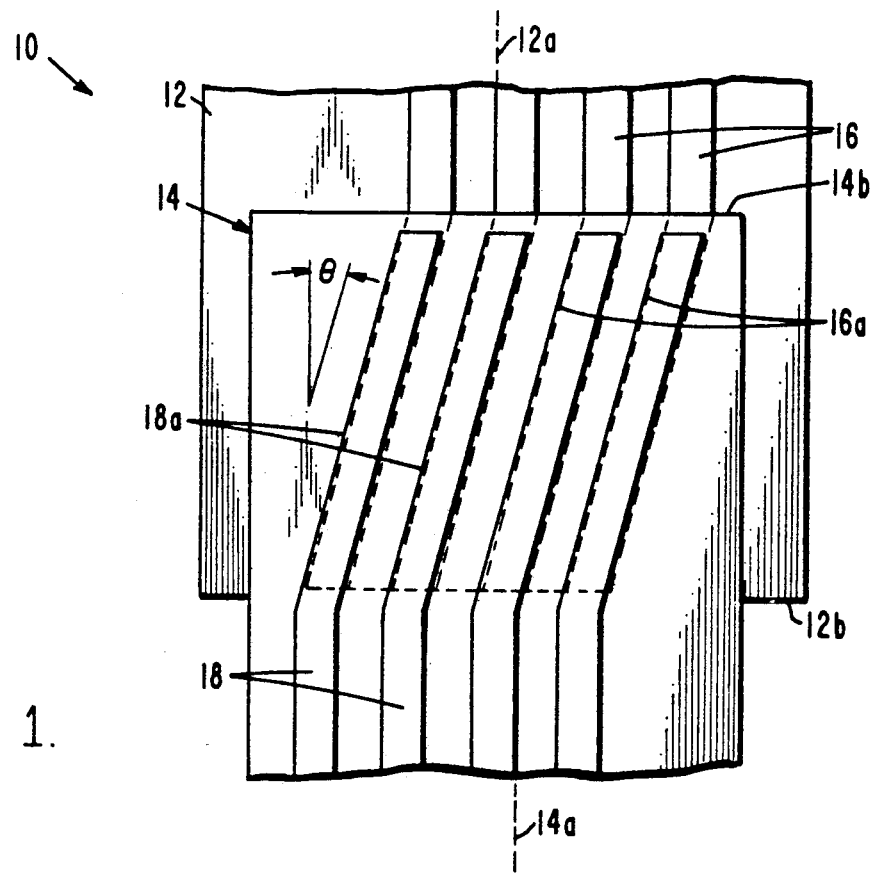
FIGS. 1 to 3 are simplified diagrams of a basic electrical connector assembly embodying the present invention.

Referring now to FIG. 1 of the drawing, a basic connector assembly embodying the present invention is generally designated as 10, and includes a first generally flat member 12 and a second generally flat member 14. Both of the members 12 and 14 may be rigid, or both of the members may be flexible within the scope of the present invention. However, in a preferred embodiment of the assembly 10, the member 12 is in the form a hardboard, whereas the member 14 is in the form of a flexible cable. The hardboard 12 has a central longitudinal axis 12a, whereas the cable 14 has a central longitudinal axis 14a.

The hardboard 12 has a plurality of electrically conductive leads or traces 16 formed on the surface thereof. The main or lead portions of the traces 16 are illustrated as extending parallel to the axis 12a, although the invention is not so limited. In accordance with an important feature of the present invention, end connector portions 16a of the traces 16 which constitute soldering pads extend to the proximity of an edge 12b of the hardboard 12 and are oriented at an acute angle $\theta$ to the axis 12a.

The cable 14 includes a flexible dielectric material such as polyimide, and carries a plurality of electrically conductive leads or traces 18 having main or lead portions which are illustrated as extending parallel to the axis 14a. The traces 18 may be formed on the lower surface of the cable 14 (which mates with the surface of the hardboard 12 on which the traces 16 are formed), or may be embedded in the cable 14. End connector portions 18a of the traces 18 which constitute soldering fingers extend to the proximity of an edge 14b of the cable 14 and are oriented at the acute angle $\theta$ to the axis 14a. Where the traces 18 are embedded in the cable 14, the flexible material is removed to expose sections of the connector portions 18a which are to be soldered to the connector portions 16a. In FIG. 1, the cable 14 is illustrated as being perfectly aligned with the hardboard 12, with the axes 12a and 14a aligned with each other, and the connector portions 18a aligned over the respective connector portions 16a.

It will be understood that the scope of the present invention includes assembly of the connector portions 18a to the connector portions 16a by means other than soldering, such as by pressure as disclosed in the above referenced patent. In the latter case, the connector portions 18a will be carried on the lower surface of the member 14.

As discussed above, where the cable 14 is formed with bends, it is difficult to shift laterally (rightwardly or leftwardly as viewed in the drawing). If the connector portions 16a and 18a extended parallel to the axes 12a and 14a as in the prior art, lateral alignment of the connector portions 16a and 18a would require lateral movement of the cable 14 relative to the hardboard 12, and would be difficult to perform. The present invention overcomes this problem, and enables the connector portions 16a and 18a to be laterally aligned by moving the cable 14 parallel, rather than perpendicular, to the longitudinal axes 12a and 14a.

Figure 2:
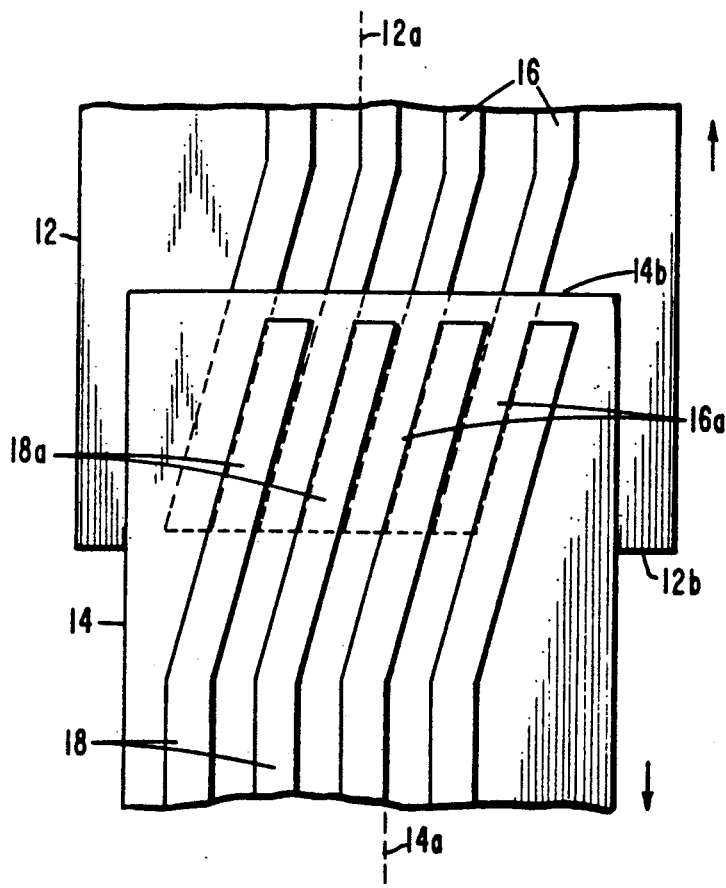
Figure 3:
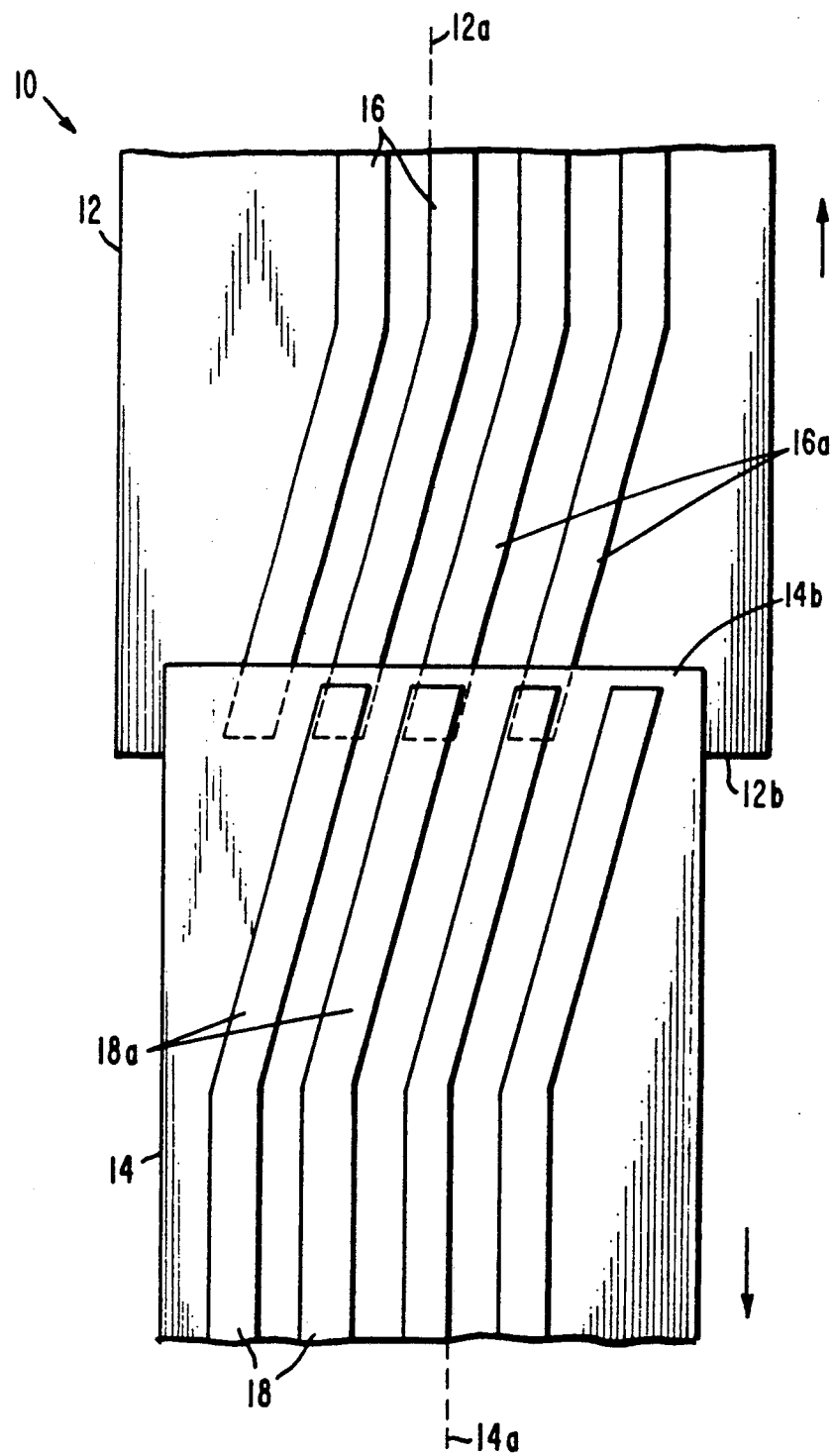

Prior to interconnection of the connector portions 16a and 18a, the cable 14 is mated to the hardboard 12 by pressing the conjugate surfaces together such that the axes 12a and 14a are substantially aligned with each other. The connector portions 16a and 18a may initially be perfectly aligned with each other as illustrated in FIG. 1, misaligned with each other by one-half pitch as illustrated in FIG. 2, or partially aligned to some intermediate degree. FIG. 3 illustrates a yet more extreme case of misalignment by one entire pitch in which the connector portions 18a are ones. The direction and amount of misalignment may be determined visually, or by instrumentation. Any detected misalignment may be corrected by longitudinally (parallel to the axes 12a and 14a) moving the cable 14 relative to the hardboard 12 until the proper connector portions 18a are aligned over the proper connector portions 16a.

The amount of lateral shift X of the connector portions 18a relative to the connector portions 16a produced by a longitudinal movement Y of the cable 14 relative to the hardboard 12 is given by $$X = Y \tan\theta$$

Conversely, where X1 is the spacing or pitch between adjacent connector portions, the amount of longitudinal movement Y1 required to laterally shift the connector portions 18a relative to the connector portions 16a by one pitch is given by $$Y1 = X1/\tan\theta$$

The configuration of FIG. 2 results from movement of the cable 14 from the position of FIG. 1 downwardly relative to the hardboard 12 by Y1/2, whereas the configuration of FIG. 3 results from downward movement by Y1. As a typical example, the angle $\theta$ may be 10°, whereby $\tan\theta = 0.18$. Thus, longitudinal relative movement by one unit will result in a lateral shift of 0.18 unit.

Figure 4:
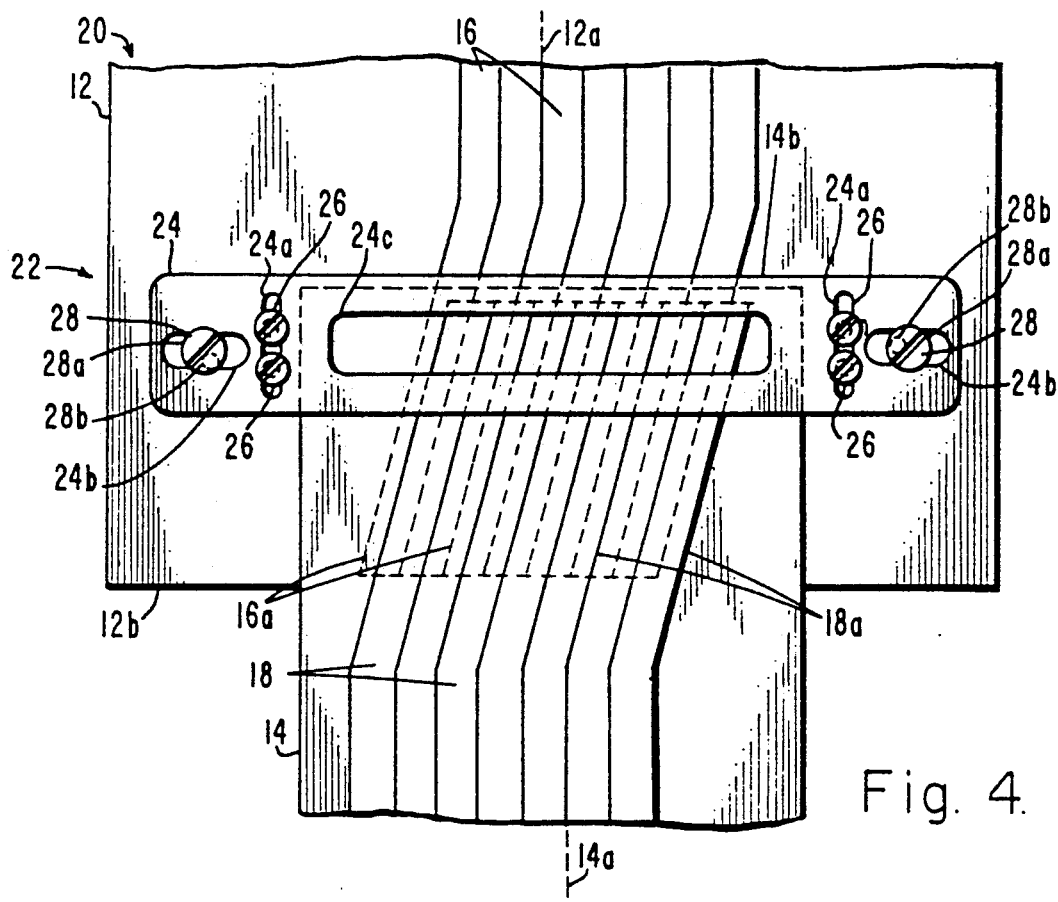
FIG. 4 is a detailed plan view illustrating a first embodiment of the present electrical connector assembly.

FIG. 4 illustrates a first embodiment of the present invention, which further includes means for aligning and clamping the cable 12 and hardboard 14 together. Like elements are designated by the same reference numerals used in FIGS. 1 to 3.

An electrical connector assembly 20 includes a clamp assembly 22 having an elongated, flat clamp member 24 which extends perpendicular to the axes 12a and 14a. The end portion of the cable 14 is fixed to the inner surface of the clamp member (which faces the hardboard 12) by means such as an adhesive (not shown) for integral longitudinal movement therewith. The clamp member 24 is formed with slots 24a extending parallel to the axes 12a and 14a, through which extend the shanks of screws or bolts 26. The screws 26 are threaded into holes (not designated) in the hardboard 12, and are spaced sufficiently apart to cooperate with the slots 24a in guiding the clamp member 24 for movement parallel to the axes 12a and 14a. The screws 26 further prevent lateral movement of the clamp member 24 perpendicular to the axes 12a and 14a. The slots 24a are made long enough to enable the clamp member 24 to move through a sufficient distance to accomplish a desired range of adjustment of the connector portions 16a and 18a. When the required alignment has been affected, the screws 26 are tightened to fix the clamp member 24 and thereby the cable 14 to the hardboard 12.

A person performing the alignment may longitudinally shift the clamp member 24 to the properly aligned position with his or her fingers. However, more precise movement of the clamp member 24 may be produced by forming one or more lateral slots 24b through the clamp member 24. Screws or pins 28 have heads 28a which have a diameter substantially equal to the width of the slots 24b and fit therein, and offset shanks 28b which fit in holes (not designated) in the hardboard 12. Rotation of the heads 28a about the offset shanks 28b causes the heads 28a to abut against the upper or lower edges of the slots 24b and cause the clamp member 24 to move upwardly or downwardly depending on the direction of rotation of the screws 28.

Where the traces 18 and connector portions 18a are buried in the cable 14, the clamp member 24 is further formed with a lateral slot 24c therethrough which spans the connector portions 18a. The slot 24c provides an opening for removal of the flexible material of the cable 14 using an excimer laser or the like to expose the connector portions 18a, and soldering of the connector portions 18a to the connector portions 16a.

Figure 5:
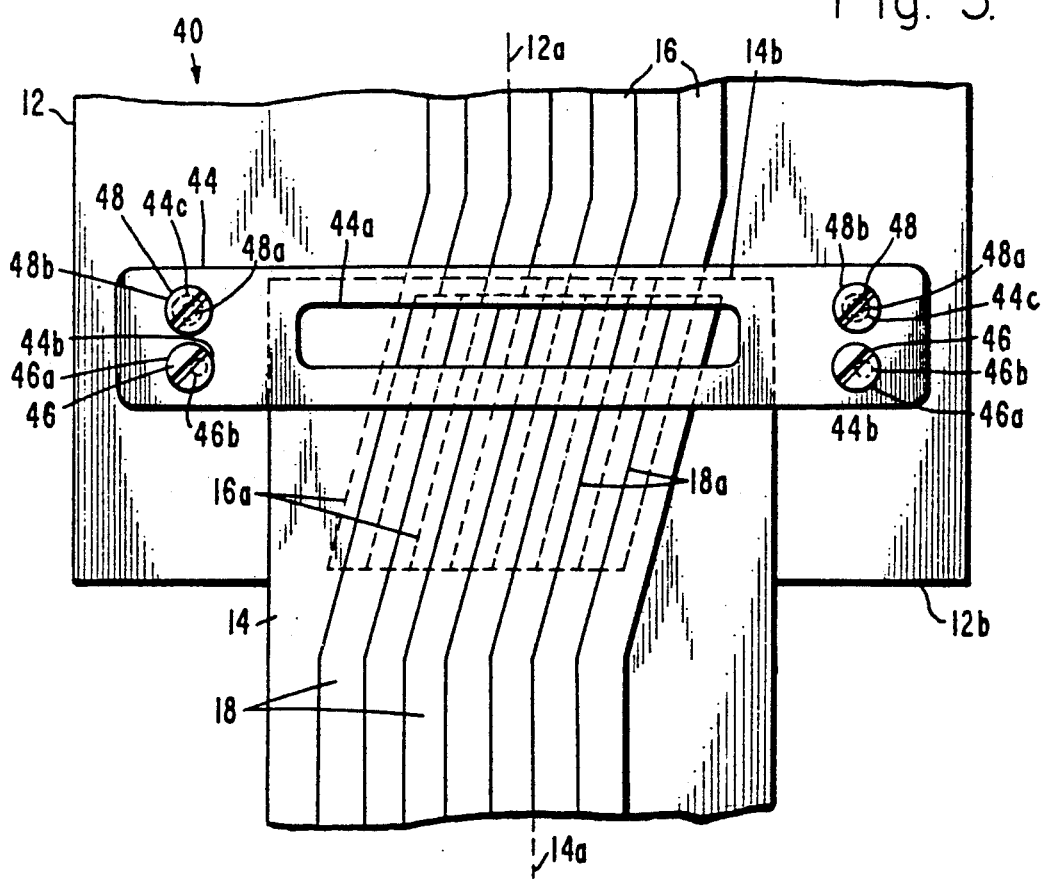
FIG. 5 is similar to FIG. 4, but illustrates a second embodiment of the present electrical connector assembly.

FIG. 5 illustrates another connector assembly 40 embodying the present invention which includes a modified clamp assembly 42 having a clamp member 44. The connector portions 18a are illustrated as being misaligned with the connector portions 16a to an intermediate degree. A slot 44a in the clamp member 44 performs the same function as the slot 24c in the clamp member 24. Screws or pins 46 having heads 46a and offset shanks 46b enable precise movement of the clamp 44 in a manner similar to the screws 28 of the assembly 20. The heads 46a of the screws 46 fit in holes 44b in the clamp member 44 which have the same diameter as the heads 46a. The shanks 46b fit in holes (not designated) in the hardboard 12.

The clamp assembly 42 differs from the clamp assembly 22 in that rotation of the screws 46 causes the respective end portions of the clamp member 44 to move both longitudinally and laterally, in arcs about the centers of the shanks 46b. The clamp assembly 42 is simpler than the clamp assembly 22, and is useful in cases where a certain amount of lateral movement of the clamp member 44 is tolerable in combination with the desired longitudinal movement. The clamp assembly 42 further includes setscrews 48 having shanks 48a which are threaded into holes (not designated) in the hardboard 12, and heads 48b. The shanks 48a extend through holes 44c in the clamp member 44, which are sufficiently larger in diameter than the shanks 48a to enable a required range of movement of the clamp member 44 and thereby the cable 14 relative to the hardboard 12.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. An electrical connector assembly, comprising:
   a first member having a first longitudinal axis;
   a plurality of electrically conductive first traces carried by the first member, including first generally parallel connector portions which are oriented at a predetermined acute angle to the first longitudinal axis;
   a second member having a second longitudinal axis;
   a plurality of electrically conductive second traces carried by the second member, including second generally parallel connector portions which are oriented at a like predetermined angle to the second longitudinal axis:
   the first and second members being mateable such that the first and second longitudinal axes are substantially aligned, and relatively movable parallel to the first and second longitudinal axes to a position in which the first and second connector portions are respectively aligned.

2. An assembly as in claim 1, in which the first and second traces further include first and second lead portions which extend from the first and second connector portions in opposite directions parallel to the first and second longitudinal axes respectively when the first and second members are mated.

3. An assembly as in claim 1, further comprising clamping means for releasably clamping the first and second members together; the clamping means, while released, substantially restraining the first and second members from relative movement perpendicular to the first and second longitudinal axes, while enabling relative movement of the first and second members parallel to the first and second, longitudinal axes.

4. An assembly as in claim 1, in which the first member comprises a hardboard having the first connector portions formed on a surface thereof; and the second member comprises a flat flexible cable having the second connector portions exposed to the first connector portions on said surface when the cable and hardboard are mated.

5. An assembly as in claim 4, further comprising clamping means for releasably clamping the cable to the hardboard; the clamping means, while released, substantially restraining the cable and hardboard from relative movement perpendicular to the first and second longitudinal axes, while enabling relative movement of the cable and hardboard parallel to the first and second longitudinal axes.

6. An assembly as in claim 5, in which the clamping means comprises:
   a clamp member fixed to the cable;
   guide means carried by the hardboard for guiding the clamp member for movement substantially parallel to the first and second longitudinal axes; and
   retaining means for releasably fixing the clamp member to the hardboard.

7. A method of electrically connecting a flat flexible cable to a hardboard, the cable and hardboard having corresponding electrically conductive traces and associated elongate connector portions for the traces, the cable and hardboard being formed along respective longitudinal axes, comprising the steps of:
   (a) orienting the connector portions at corresponding like acute angles to the axes of their respective cable and hardboard so that the connector portions extend in a direction which has a component that is lateral to the cable and hardboard axes;
   (b) bringing the cable and hardboard together with their axes generally aligned; and
   (c) adjusting the relative positions of the cable and hardboard generally parallel to their axes to mutually align and establish electrical contacts between the connector portions for their corresponding traces.

8. A method as in claim 7, further comprising the step, performed after step (c), of:
   (d) soldering the aligned connector portions of the cable to the connector portions of the hardboard respectively.

9. A method as in claim 7, further comprising the step, performed after step (c), of:
   (d) clamping the cable and hardboard together.

10. A method as in claim 7, in which step (c) comprises restraining the cable and hardboard from relative lateral movement while adjusting the relative positions of the cable and hardboard parallel to their axes.

* * * * *